(12) United States Patent
Schmatz

(10) Patent No.: US 7,050,522 B2
(45) Date of Patent: May 23, 2006

(54) PHASE ROTATOR AND DATA RECOVERY RECEIVER INCORPORATING SAID PHASE ROTATOR

(75) Inventor: Martin Schmatz, Brugg (CH)

(73) Assignee: International Business Machines Corporation, Armonk, NY (US)

( * ) Notice: Subject to any disclaimer, the term of this patent is extended or adjusted under 35 U.S.C. 154(b) by 625 days.

(21) Appl. No.: 09/861,668

(22) Filed: May 22, 2001

(65) Prior Publication Data

US 2002/0009170 A1     Jan. 24, 2002

(30) Foreign Application Priority Data

May 26, 2000   (EP)  ................................. 00111369

(51) Int. Cl.
*H04L 25/00*   (2006.01)
*H04L 25/40*   (2006.01)
*H04L 7/00*    (2006.01)

(52) U.S. Cl. ..................................... 375/371

(58) Field of Classification Search ......... 375/371–376
See application file for complete search history.

(56) References Cited

U.S. PATENT DOCUMENTS

| 4,639,939 A | * | 1/1987 | Hirosaki et al. | ............ 375/371 |
| 6,628,738 B1 | * | 9/2003 | Peeters et al. | ............... 375/371 |

\* cited by examiner

*Primary Examiner*—Stephen Chin
*Assistant Examiner*—Curtis Odom
(74) *Attorney, Agent, or Firm*—Wan Yee Cheung, Esq.; McGinn IP Law Group,PLLC

(57) ABSTRACT

A phase rotator device for phase shifting an oscillating signal, including an input device having at least one input channel for receiving at least one phase of the oscillating signal and an output device having at least one output channel for delivering at least one phase of the oscillating signal with a controlled phase shift. For each output channel, the phase rotator includes a weighting device for weighting the value of the oscillating signal at each input channel by a respective weighting coefficient, and a summing device for summing the weighted signal values at each input channel and delivering the summed value as a shifted output phase at the output channel. Additionally, the phase rotator device includes a weighting coefficient supply device responsive to a phase shift control signal for controllably supplying evolving weighting coefficients to the weighting device, thereby to create a phase shift at the output channel.

39 Claims, 7 Drawing Sheets

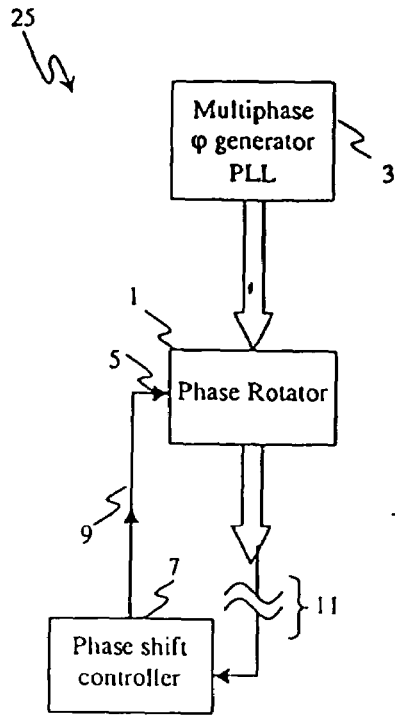
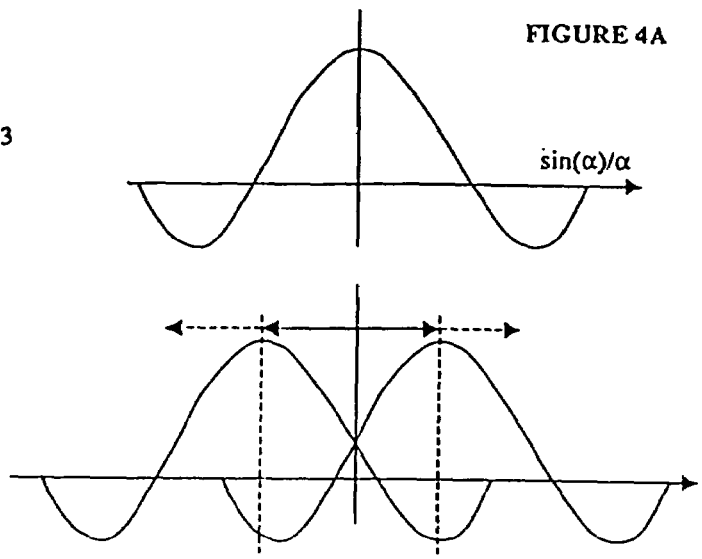
FIGURE 4A
FIGURE 4B
FIGURE 3
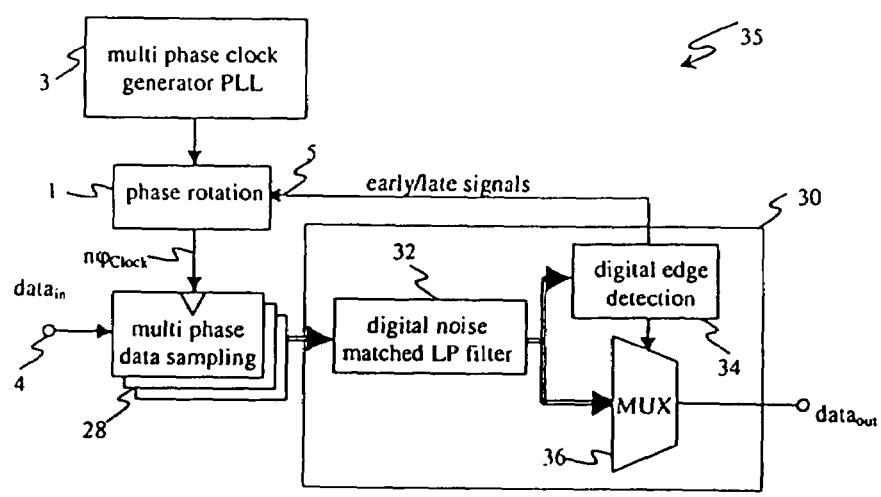
FIGURE 5

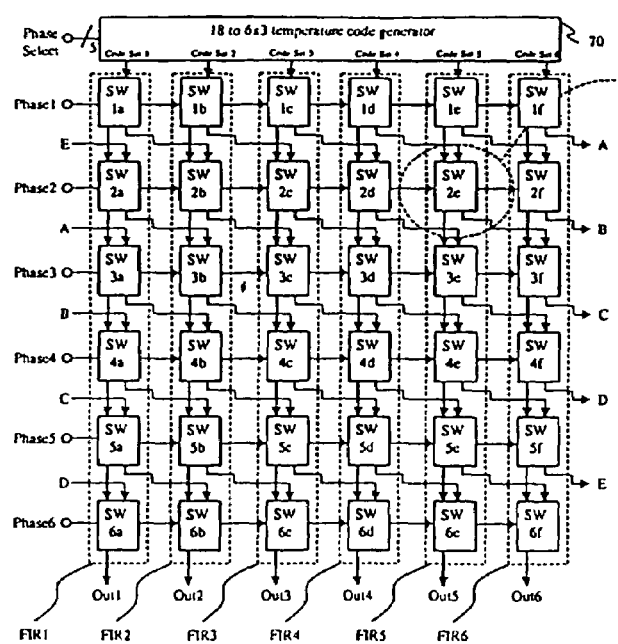
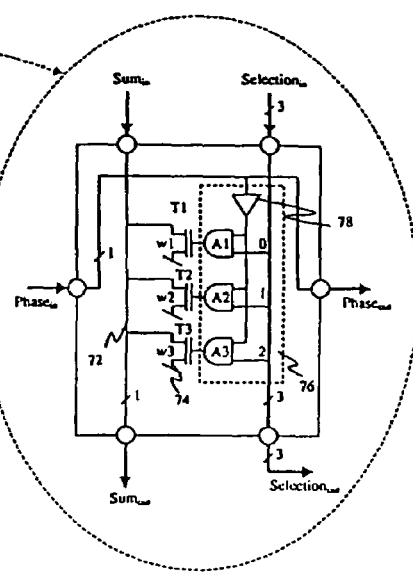
FIGURE 12A
FIGURE 12B

PHASE ROTATOR AND DATA RECOVERY RECEIVER INCORPORATING SAID PHASE ROTATOR

The present disclosure relates to subject matter contained in Japanese Patent Application No. EP00111369.5, filed May 26, 2000, which is expressly incorporated herein by reference in its entirety.

BACKGROUND OF THE INVENTION

1. Field of the Invention

The present invention generally relates to a phase rotator device and to a data recovery receiver incorporating the phase rotator device, e.g. for use in digital data communications based on high speed wire link technology for high-speed digital switches involving clock and data recovery (CDR). More specifically, the invention concerns a phase rotator capable of producing a controlled phase shift, e.g. on a multiphase input clock signal, and a data recovery receiver incorporating such a phase rotator in a feedback control loop for synchronously tracking level transitions in a high-speed data stream.

2. Description of the Related Art

When performing CDR, conventional systems track possible phase variations in an incoming data stream in order to ensure that all the information-carrying level transitions can be followed synchronously. To this end, the incoming data signal stream is processed by a CDR receiver which is capable of phase agility.

Now the speed of switches, especially in the context of internet switches, is currently developing fast. With this growth in speed, a problem now resides at the level of link technology, which is becoming the limiting factor for feeding data into and out of a digital core. Indeed, a digital core can comprise up to one hundred or more data links on one single digital chip.

In addition, such a chip performs digital functions which consume tens of Watts at few volts of power supply voltage, which means that tens of amps flow into and out of the chip at a few nano-seconds of cycle time. This creates a very noisy environment in terms of power supply swing, substrate noise, etc.

Under these conditions, there is a need for circuit structures that can perform CDR on the incoming data stream with a satisfactory bit error rate while being able to handle very high frequencies, e.g. up to 2.5 GHertz or more.

CDR circuit structures known in the art can be divided into two main categories: conventional analog-based phase-locked loop (PLL) feedback CDR receivers and digital oversampling receivers.

FIG. 1 is a simplified block diagram showing a typical analog PLL feedback CDR receiver circuit. The circuit 2 has an input terminal 4 which receives a data input signal $Data_{in}$ that may be transmitted in differential form. The input is divided into first and second branches b1 and b2, respectively, for effecting a clock recovery and a data recovery.

The first branch b1 forms an input to a PLL circuit 6. The latter classically comprises a phase comparator 8 having two phase comparison inputs $\phi_a$ and $\phi_b$, a low-pass filter 10 and an analog voltage controlled oscillator (VCO) 12. The phase detector 8 receives the input data signal $Data_{in}$ and a quadrature output (Q) from the VCO at its respective phase comparison inputs $\phi_a$ and $\phi_b$, and outputs a voltage control signal to the VCO 12 via the low pass filter 10. In this way, the VCO is forced to track the frequency of the incoming data input signal by maintaining a zero phase difference between the phase comparison inputs $\phi_a$ and $\phi_b$. The low pass filter ensures that the feedback loop containing the VCO 12 is kept within the frequency response of the latter. In the example, the clock recovery signal (clock out) is taken out from an in-phase output (I) of the VCO for optimally sampling the data.

The above in-phase signal from the VCO 12 also serves as a sampling clock signal for a data sampling circuit 14, the data input of which receives the data input signal from the second branch b2. The data sampling circuit thereby produces at an output terminal 16 the data output signal $Data_{out}$ corresponding to the data input signal sampled at the instantaneous recovered clock frequency.

Thus, the output phase of the VCO 12 is controlled to match the optimum sampling point position by means of the PLL feedback control loop. Feedback control loops in general have a bandwidth limitation in the region of one tenth of the feedback frequency due to stability problems.

The above approach is the most commonly used owing to its simple structure. It served well in the past in applications which did not require very high frequencies and used only one channel, without relying on digital oversampling techniques.

FIG. 2 is a simplified block diagram showing a digital oversampling feed forward receiver with 'a posteriori decision'. In this circuit, the incoming data stream is oversampled (i.e., sampled more than once per period of the input signal) to determine the data transition positions, also known as the edges of the data. The edge information serves as a basis for selecting, or "phase picking", the best sample as data value in an "a posteriori step."

The circuit 20 comprises a PLL unit 22 which delivers a number n of clock output phases $n\phi_{Clock}$ each having a common frequency corresponding to that of a reference signal $Fin_{ref}$, but at different phases relative to each other. The PLL unit is classically constructed from a multi-phase output VCO 24 connected to a PLL feedback loop 26 which receives the reference frequency signal $Fin_{ref}$. The latter is made to correspond as closely as possible to the frequency of the incoming data stream $Data_{in}$. The PLL feedback loop 26 generally includes a phase comparator for comparing an output phase of the VCO 24 with the phase of the reference frequency $Fin_{ref}$, the comparison output being fed back to the control input of the VCO via a low-pass filter.

The n different phases from the VCO 24 are supplied as clock signals to respective ones of a set of n oversampling latches 28. The n oversampling latches each receive the signal $Data_{in}$ in from the incoming data stream. Thus, for each period of the incoming data, the latches 28 sample different points of the signal waveform.

The n thus-sampled signals are supplied to what is known as a phase picking engine 30, whose function is to determine the position of the edge transitions in the incoming data on the basis of these sampled values.

The phase picking engine 30 shown in FIG. 2 comprises a digital noise matched low-pass filter 32 forming an input stage for the n sampled values. After the filter stage, the n sampled values are supplied to respective data inputs of a digital edge detector 34 and to an n-to-1 multiplexer 36 which delivers the recovered data $Data_{out}$ at a data output terminal 16. The digital edge detector 34 effectively identifies the later one of two chronologically successive samples that marks a transition in the incoming data signal, and commands the multiplexer 36 to designate that sample point as the basis for establishing the recovered data output Data$_{out}$. This sample (referred to as the best sample) is thus selected as the data value for a particular signal period in an a posteriori step.

The above circuit implements a feed forward method with no inherent bandwidth limitation and potential non-causal data processing. Digital circuits after the sampling stage (e.g. a bit shifter and byte FIFOS) can take care of wrap-around effects occurring when there is a slight offset in the input data rate and the reference frequency.

Both of the above types of CDR receivers have their advantages and disadvantages.

The approach described with reference to FIG. 1 is based on an analog control of the clock frequency and has an inherently limited jitter tracking bandwidth, but unlimited frequency tracking capability.

The approach described with reference to FIG. 2 is purely digital and makes it possible to track jitter frequencies up to the bit rate, but only with limited jitter amplitude. There is no feedback from the sampling logic to the clock-generating PLL. Therefore, one PLL can serve several receivers.

The positive and negative points of the above-described CDR systems are summarised in Table I below. It may be noticed that the table entries are somewhat orthogonal for the two approaches, i.e. an advantage of one approach is a disadvantage of the other.

TABLE I comparison of merits between analog and digital CDR receivers.

Analog PLL-based CDRs

Advantages:

unlimited jitter amplitude tracking;
simple structure;
only one sample has to be processed.

Disadvantages:

inherent jitter tracking bandwidth limitation;
analog control;
no averaging possible;
one PLL per channel required.

Oversampling-based digital CDRs

Advantages:

jitter suppression up to bit rate frequency;
digital control;
'a posteriori' data/edge analysis;
single PLL for several channels.

Disadvantages:

limited jitter amplitude tracking;
complex structure;
multiphase oscillator required.

SUMMARY OF THE INVENTION

In view of the above, it is an object of the invention to provide a structure and method for offering advantages of both analog PLL-based CDRs and oversampling-based digital CDRs.

According to the invention, this object is achieved by a phase rotator device for controllably effecting a phase shift on an oscillating signal (that may be of square waveform), comprising an input device having at least four input channels for receiving at least four phases of the oscillating signal and an output device having at least one output channel for delivering at least one phase of the oscillating signal with a controlled phase shift. Each of the output channels includes a weighting device for weighting the value of the oscillating signal at each input channel by a respective weighting coefficient, a summing device for summing the weighted signal values at each input channel and delivering the summed value as a controllably shifted output phase at the output channel, and a weighting coefficient supply device responsive to a phase shift control signal for controllably supplying evolving weighting coefficients to the weighting device thereby to create a phase shift at each of the output channels.

In one embodiment, the phase rotator device includes four input channels which provide filtering that may be reasonably applied in order to filter out the higher order harmonic frequency components. The phase rotator is preferably adapted to process phase shift control signals in digital form so as to form a digitally controlled phase rotator.

Preferably, the phase rotator comprises an analog filtering device for each output channel. The analog filtering device may be an inherent or intrinsic part of the weighting means and/or the summing means.

Depending on applications, the phase rotator may optionally comprise a second analog low pass filtering device operative for filtering the input signals.

Concerning the filtering aspect, it can be noted that the phase rotator is based on adding weighted phase information from the input phases. If it is required to obtain smooth output curves (e.g. looking like a sine wave) from non-smooth inputs, some filtering is needed. If the signal is oversampled, the filter requirements can be relaxed by the factor of oversampling, so that a smooth curve is obtained with a low order low pass filter even with square wave input signals. If a perfectly—or near perfectly—smooth curve is already applied to the input, then no filtering may be required at all.

Because the adding function is a linear operation, filtering before or after the summation are equivalent operations. A low-pass filter is required for input signals that are non sinusoidal, but it may shown from circuit theory that the position of that filter can be changed from the output to the input without changing the circuit qualitatively. The filter function can also be split so that some portion of the filter is applied at the input and some at the output.

In general, some low pass filtering at the input may relax the filtering requirements of the low pass filter for the output channels, and the two filters (for input and output signals) will have the overall effect of one, more complex, filter.

Thus, the phase rotator can be made to function with input signals in the form of either (near) square waves or continuously evolving waveforms, such as pure sine waves.

This filtering may be carried out inherently by the finite frequency range of the summing means.

The phase shift applied to any of the output channels may differ from the phase shift applied to all other channels. The phase shift of each output channel may by controlled individually.

In a typical application, the input means comprises a plurality of n input channels each adapted to receive a respective phase slice of the oscillating signal. Preferably, the number n of input channels is 6 or 8, although a larger or smaller number of input channels can be envisaged according to applications.

The output means may also comprise a plurality of output channels, the input and output channels being e.g. equal in number. Typical numbers of output channels are 1, 2, 4, 6 or 8, the number of input channels, or less than the number of input channels.

Advantageously, the weighting coefficient supply means is arranged to cause the weighting coefficients at the input channels to evolve in a series of transition steps, an integral number m of transition steps creating a phase shift of one phase slice.

The number m of transition steps for creating a phase shift of one slice is preferably equal to one half the number of input channels.

In the preferred embodiments, the weighting coefficients are adapted to evolve controllably for effecting a phase shift in successive phase slices over a phase angle of $2\pi$ radians (360°) in a cyclic operation, thereby permitting an unlimited phase shift.

In a typical operation, the distribution of weighting coefficients among the input channels at some of the intermediate transition steps at least may be unbalanced about the symmetry line of the n input channels.

Preferably, in order to minimize duty cycle distortion, each transition step involves a change in only some among the weighting coefficients applied at each of the input channels.

In this case, it can be envisaged that at least one of the m transitions steps, and preferably all the intermediate transition steps, involves a change of weighting coefficient at one or more input channels on either side of the symmetry line of the n input channels.

In the preferred embodiments, the weighting coefficients are each formed by an additive combination of sub-weights.

The weighting coefficient supply means can then be arranged to add or remove selectively one sub-weight per transition step to a weighting coefficient to be changed at that transition step.

The sub-weights can be switched in or out of the additive combination by digital control signals generated by the weighting coefficient supply means in the form of temperature codes.

Advantageously, a weighting coefficient is expressed as a current produced by selectively adding current components each corresponding to a sub-weight forming the weighting coefficient.

The current corresponding to a sub-weight may be controlled by the ON resistance of a transistor. For instance, the latter can be a MOS transistor having a specific channel width which determines the current corresponding to the associated sub-weight.

In one embodiment, at least one sub-weight is composed of an additive combination of sub-sub-weights.

In this case, the weighting coefficient supply means can be arranged to add or remove selectively one sub-sub-weight per transition sub-step to a weighting coefficient to be changed at that transition step.

For each of the output channels, the weighting coefficient supply means preferably produces a same set of n weighting coefficients, the latter being applied at mutually staggered positions among the input channels of the output channels. This enables the number of different weighting coefficients to be kept small and hence more easily manageable.

According to a second aspect, the present invention provides a device for producing an oscillating signal with a an adjustable phase shift, comprising a phase rotator of the type defined above; and phase shift control signal generator producing a phase shift control signal to the phase rotator for effecting a controlled phase shift at the output means.

The invention finds a particularly advantageous application in a data recovery receiver for receiving an input data stream and producing a recovered data signal therefrom, comprising multiphase oscillating signal generator, the means having n outputs respectively delivering n phases of the oscillating signal, with n>1; multiphase data sampler cooperating with the multiphase oscillating signal generator for receiving a data stream and producing oversampled information therefrom; and edge picking means for determining on the basis of the oversampled information the positions of transitions in the data stream and producing the recovered data in the form of transitions at an output; characterised in that it further comprises a phase rotator of the type defined above, the phase rotator receiving at its input means the n phases of the oscillating signal from the multiphase signal generator and delivering at its output means a plurality of output phases of said oscillating signal to the multiphase sampler, the edge picking means having a feedback loop to the phase rotator to deliver thereto a phase shift control signal in response to the oversampled information.

The above circuit configuration makes it possible to separately manage a plurality of incoming data streams while using just one multiphase oscillating signal generator. In this case, the data recovery receiver has a plurality of data recovery channels, each channel being adapted to receive a respective input data stream and producing a recovered data signal therefrom, and comprises multiphase oscillating signal generator, the means having n outputs respectively delivering n phases of the oscillating signal, with n>1; and for each data recovery channel multiphase data sampler for receiving a data stream and producing oversampled information therefrom; edge picking means for determining on the basis of the oversampled information the positions of transitions in the data and producing the recovered data in the form of transitions at an output; and a phase rotator of the type defined above, the phase rotator receiving at its input means the n phases of the oscillating signal from the multiphase signal generator and delivering at its output means a plurality of output phases of the oscillating signal to the multiphase sampler, the edge picking means having a feedback loop to the phase rotator to deliver thereto a phase shift control signal in response to the oversampled information.

The edge picking means can be based on one or a combination of: correlating functions, look-up tables, numerical derivatives or similar modem signal processing techniques to extract the positions of transitions and the values of the bits.

The phase shift control is preferably in digital form. The shift control signal can be an early/late signal expressing whether the transitions occur before or after their expected times of arrival.

The static edge position is advantageously held at a constant position in the multiphase data sampler by a constant adjustment of the sampling phases by the early/late signals.

Advantageously, the multiphase oscillating signal generator is outside the feedback loop. This generally enhances the stability margin in the feedback loop.

The multiphase oscillating signal generator preferably comprises a ring oscillator formed of n delay elements connected in a ring and controlled by a phase-locked loop, each delay element having an output tap from which is taken a respective one of the n phases of the oscillating signal. The multiphase oscillating signal generator may also be comprised of n delay elements that are controlled by a delay locked loop, a single phase oscillator followed by one or several stages of divide-by-two circuits, or of any other multiphase generating circuit with substantially constant output frequency.

The oscillating multiphase signal is typically set to have a frequency substantially equal to the data rate of the incoming data stream.

The receiver according to the invention can be constructed on a single chip, and even more than one receiving channel may be implemented. In the latter case, one multiphase generator may be shared between several receivers.

The multiphase signal generator may comprise a stable or stabilized oscillator running at a higher frequency, followed by one or several stages of frequency dividing circuits to generate several phases from which is taken a respective one of the n phases of the oscillating signal.

The invention also provides a method of controllably effecting a phase shift on an oscillating signal, in which at least four phases of an oscillating signal is received on at least four input channels and is reproduced on at least one output channel with a controlled phase shift; characterised in that it comprises the steps of for each output channel weighting the value of the oscillating signal at each input channel by a respective weighting coefficient; and summing the weighted signal values at each input channel and delivering the summed value as a shifted output phase at said output channel; and controllably supplying evolving weighting coefficients to said weighting means thereby to create a phase shift at the or each output channel.

The phase shift applied to any of the output channels may differ from the phase shift applied to all other channels. The phase shift of each output channel may by controlled individually. The optional characteristics set forth above for the phase rotator device can be optionally implemented with the necessary changes being made in this process.

The present invention also relates to a method of recovering data from an input data stream and producing to produce a data signal therefrom, comprising the steps of generating a multiphase oscillating signal at n outputs respectively delivering n phases of the oscillating signal, with n>1 effecting multiphase data sampling on the input data stream using the multiphase oscillating signal and producing oversampled information therefrom; and determining on the basis of the oversampled information the positions of transitions in the data and producing the recovered data in the form of transitions at an output; characterised in that the multiphase data sampling is effected using respective output phases of a phase rotator as defined above, the phase rotator receiving at its input means the n phases of the oscillating signal and receiving a phase shift control signal in a feedback loop on the basis of the detected positions of transitions in the data.

Finally, the invention concerns a method of recovering data from a plurality of data recovery channels, each channel being adapted to receive a respective input data stream and producing a recovered data signal therefrom, comprising the steps of generating a multiphase oscillating signal at n outputs respectively delivering n phases of said oscillating signal, with n>1; and for each data recovery channel effecting multiphase data sampling on the input data stream using the multiphase oscillating signal and producing oversampled information therefrom; and determining on the basis of the oversampled information the positions of transitions in the data and producing the recovered data in the form of transitions at an output; wherein, for each data recovery channel, the multiphase data sampling is effected using respective output phases of a phase rotator as defined above, the phase rotator receiving at its input means the n phases of the oscillating signal and receiving a phase shift control signal in a feedback loop on the basis of the detected positions of transitions in said data.

Preferably, the control signals are in digital form.

The optional characteristics set forth above for the receiver device can be optionally implemented with the necessary changes being made in these data recovery processes.

BRIEF DESCRIPTION OF THE DRAWINGS

The foregoing and other objects, aspects and advantages will be better understood from the following detailed description of a preferred embodiment of the invention with reference to the drawings, in which:

FIG. 3 is a simplified block diagram showing a generalized circuit application of the phase rotator in accordance with the invention;

FIG. 4a shows a sinusoidal waveform derived from a PLL based multiphase clock oscillator;

FIG. 4b shows the waveform of FIG. 4a phase shifted in positive and negative directions by the phase rotator of FIG. 3;

FIG. 5 is a simplified schematic diagram of a data recovery circuit implementing a phase rotator in a structure which combines digital feed forward principles with a feedback loop in accordance with the invention;

FIG. 12A is a simplified block diagram of an implementation of a phase rotator in accordance with the invention processing six phase slices and performing a phase shift of one slice in a three-step transition process; and FIG. 12B is a more detailed circuit diagram of a summing and weighting block implemented in the phase rotator of FIG. 12A.

DETAILED DESCRIPTION OF A PREFERRED EMBODIMENT OF THE INVENTION

Figure 1:
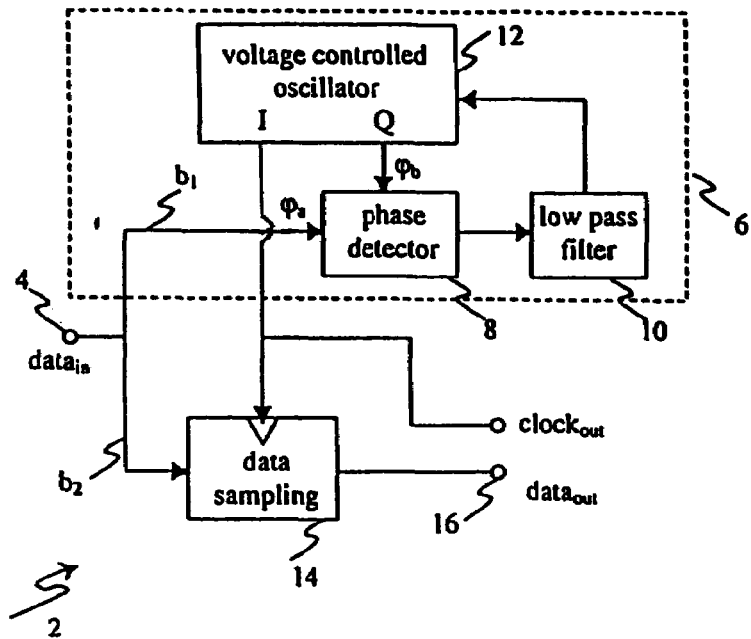
FIG. 1 is a simplified block diagram of a clock and data recovery receiver for a single channel based on a VCO in an analog feedback loop.

Referring now to the drawings, and more particularly to FIG. 3, there is shown a basic circuit implementation 25 of the phase rotator 1 in accordance with the invention. The phase rotator is here represented as a functional unit which receives at an input n phases from a multiphase clock generator phase-locked loop (PLL) 3, such as a ring oscillator, and in response produces a step-by-step adjustable, glitch-free modulo shift of those n phases. The number n of input phases is arbitrary, and can also be equal to 1. The phase shifted output can be delivered also as an n-phase clock signal, or a signal having a different number phases, for example 1 or n/2 phases. Typically, the multiphase clock generator PLL is digital in nature, being based e.g. on a ring oscillator having tapped outputs corresponding to different phase slices of the clock signal.

The amount of shift is controllable through a control input 5 of the phase rotator. The control signal is typically in digital form, the phase rotator being adapted to produce a phase shift under digital control. In the simple example, the control signal is elaborated by a phase shift controller 7 arranged in a feedback loop 9 comprising circuitry 11 which processes the phase rotator output signal.

FIG. 4A shows the signal waveform formed by the multiphase PLL 3 and FIG. 4B shows how this waveform can be phase shifted in either direction to any degree by the phase rotator through the control signal applied at its control input 5. It can thus be seen that the phase can be rotated controllably and in real time by an arbitrary angle relative to the inputted clock signal phases.

The modulo option guarantees phase and frequency compensation capability. The step-by-step control implies that the amount of phase change is limited to one phase slice for each clock cycle. The glitch-free performance ensures that no bits are lost during phase rotation.

The detailed description of the internal construction and operation of the phase rotator according to the invention is given below with reference to FIGS. 7 to 12.

There shall now be described with reference to FIGS. 5 and 6 how the present phase rotator can be implemented in a clock and data recovery (CDR) receiver according to the invention.

FIG. 5 is a block diagram showing the main elements of the CDR receiver 35. Its construction differs from the digital CDR receiver of FIG. 2 essentially by the presence of the above phase rotator 1 which, as shall be explained in more detail, is in a feedback loop with the correlation engine 30.

Figure 2:
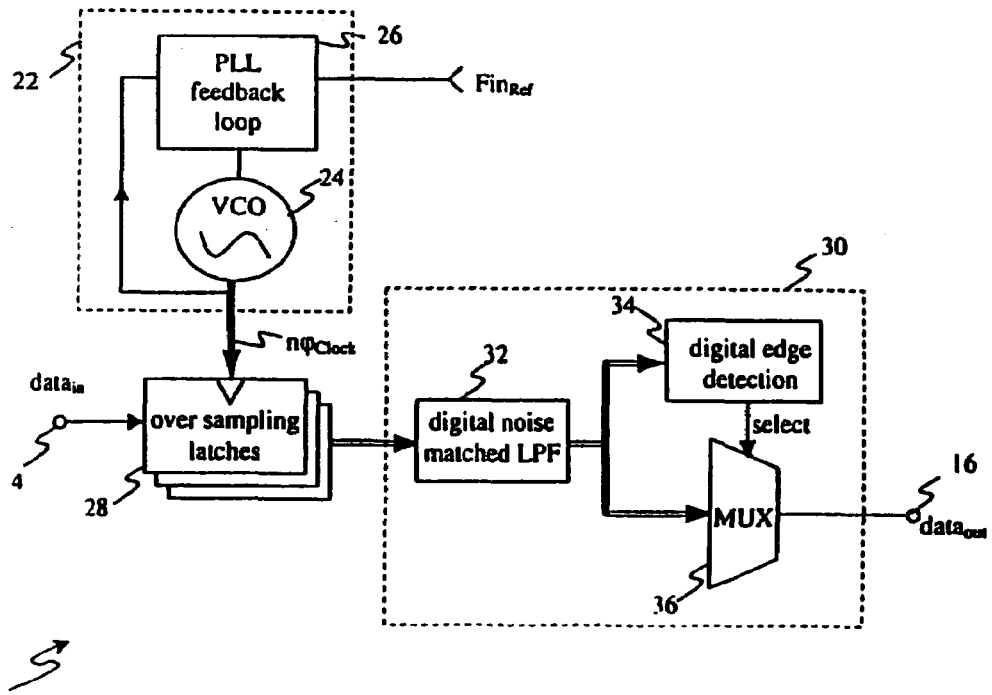
FIG. 2 is a simplified block diagram of a digital oversampling feed forward clock and data recovery receiver with a posteriori decision.

In the illustrated example, the construction and operation of the correlation engine 30 is the same as in FIG. 2 and shall not be described again for conciseness. The input data stream data in is likewise supplied to a terminal 4 from which it is transferred to a set of n oversampling latches 28. The latter deliver the n-times oversampled input data in parallel to the digital edge detector 34 and multiplexer 36 via the digital noise matched low-pass filter 32.

The n different clock phases nφck which supply the n sampling latches 28 are produced at the output of the phase rotator 1. The latter is supplied with n phases from a feedback-controlled oscillator, for instance a ring oscillator circuit controlled by a phase-locked loop as in the case of FIG. 2.

In addition to selecting the optimum data samples (by edge detection), the correlation engine 30 generates "early/late" digital control signals if the detected edge signal is not at its expected position. The early/late signals are generated at the level of the digital edge detector 34 using techniques which are known in themselves. No early/late signal is generated if no edge is found.

The early/late signals are used to dynamically control the phases of the clock inputs to the multiphase data sampling latches 28 at the level of the phase rotator 1. Specifically, the early/late signals from the edge detector 34 are transmitted in a feedback loop to the control input 5 of the phase rotator so that the latter can advance the phase if a late signal is received and retard the phase if an early signal is received.

In the example, the early/late signal is simply a two-state signal, a first state (for instance logic 1) indicating that the edge is detected early, and a second state indicating that the edge is detected late. These successive early/late signals thereby enable to correct the sampling phases using what is termed a "bang-bang" approach (i.e., by simply determining if the edges arrive too early or too late). From this information, it is decided using an early/late signal counter (not shown) whether—and to what extent—the phases delivered by the phase rotator should be adjusted. An adaptive filter algorithm can be implemented between the counter and the decision circuitry. The adaptive filter algorithm has a low-pas, high averaging factor.

The feedback loop which sends the early/late signals from the edge detector 34 to the control input 5 of the phase rotator 1 effectively takes care of low-frequency jitter phenomena of unlimited amplitude, while the feed forward part of the circuit suppresses high frequency jitter having limited amplitude. The static edge position is held at a constant position in the oversampled data array by a constant adjustment of the sampling phases with the early/late signals.

It can be noted that the early/late signals could be used to directly control the output phase positions of the multiphase clock signal generator PLL 3. This would however dictate the use of one PLL oscillator per incoming data stream sample. On the other hand, by employing a phase rotator 1 interposed between the multiphase clock generator PLL 3 and the oversampling latches 28 for controlling the input phases to the latter in the feedback loop, the clock generator PLL is effectively placed outside the feedback loop. Accordingly, one multiphase phase clock generator PLL can be used to supply a plurality of independent CDR receiver channels.

The fact that the multiphase clock generator PLL can be placed outside the feedback loop controlling the shifting of the phases for the oversampling latches is particularly advantageous. Indeed, the closed loop equations for a VCO-based oscillator such as the ring oscillator of FIG. 3 produces a 1/s integrator function. This function results from the fact that a sequence of a phase correction step at the input generates a ramp at the output, due to the VCO's integrative characteristic. By contrast, a phase correction step effected at the level of the phase rotator 1 remains in the phase domain and generates no ramp. The elimination of the 1/s integrator function made possible by the phase rotator contributes significantly to easing stability problems.

Moreover, the possibility of having just one oscillator for many parallel links can drastically reduce the number PLL oscillators present on a chip. This not only leads to a more efficient use of chip space and reduced power consumption, but also eliminates problems due to power supply and substrate coupling between oscillators.

It can be seen that the CDR receiver in accordance with the invention combines advantages of both the analog PLL based CDR receiver such as shown in FIG. 1 and the digital CDR such as shown in FIG. 2. In particular, the present CDR receiver makes it possible to effect fine phase adjustments through a feedback loop while maintaining the possibility of employing a digital oversampling technique. As shall be apparent from the detailed description of the phase rotator, the phase adjustment steps can be made arbitrarily fine so that the phase shift operation can effectively mimic that of an analog VCO oscillator.

The phase rotator 1 can be made to operate with incoming data streams in the region of 2.5 GHz at the present state of technology. Its circuit implementation allows clock and/or data recovery on as many as 100 or more data streams on a single chip.

Figure 6:
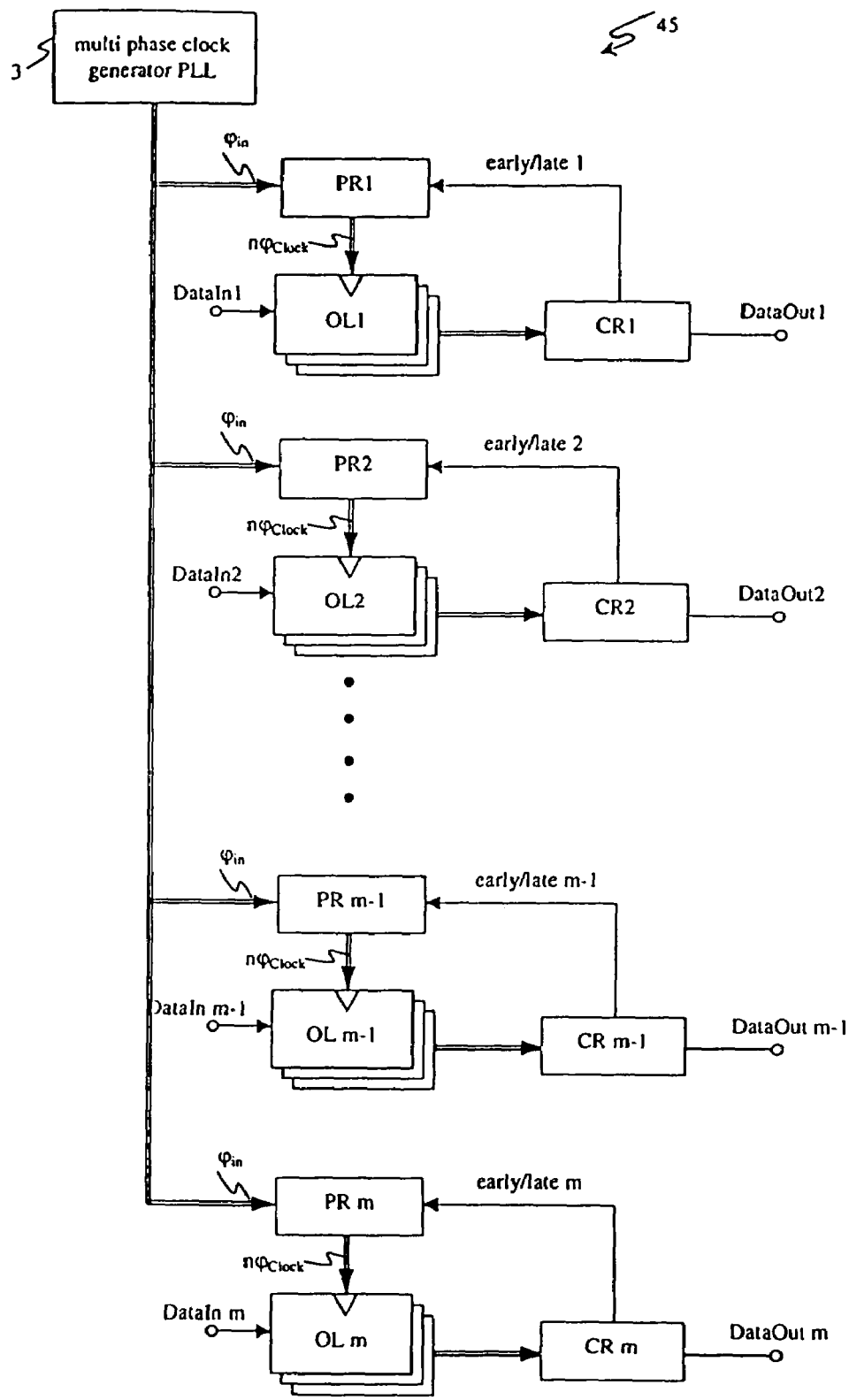
FIG. 6 is a simplified schematic diagram of a circuit application based on m data recovery circuits of FIG. 5 processing respective data streams and supplied by a common multiphase clock generator.

FIG. 6 illustrates how the circuit configuration of FIG. 5 can be extrapolated to a receiver 45 performing clock and/or data recovery on m separate incoming data input streams using just one PLL oscillator 3.

The n phases produced by the oscillator 3 are supplied in parallel to the respective phase inputs $\phi_{in}$ of each of the m phase rotators PR1–PRm. From that point on, each CDR receiver channel performs its own data recovery with any necessary phase shift effected at the level of its own phase rotator. Each of the m CDR receiver channels is composed of a specific phase rotator, set of oversampling latches OL1–OLm and correlation engine CR1–CRm.

Thus, each phase rotator produces from the n-phase clock signal its own set of n adjustable output phases, which are sent to a set of respective oversampling latches OL1–OLm. The latter each produce a set of sampling points to its associated correlation engine CR1–CRm, the latter producing one of the m recovered data outputs Data Out1–m from its corresponding data input Data In1–m.

The early/late signals from each of the correlation engines CR1–CRm is fed back to the control input 5 of its corresponding phase rotator, which is downstream of the PLL oscillator 3. In other words, the oscillator 3 generating the input clock phases to each channel is outside the feedback loop of the latter.

Figure 7:
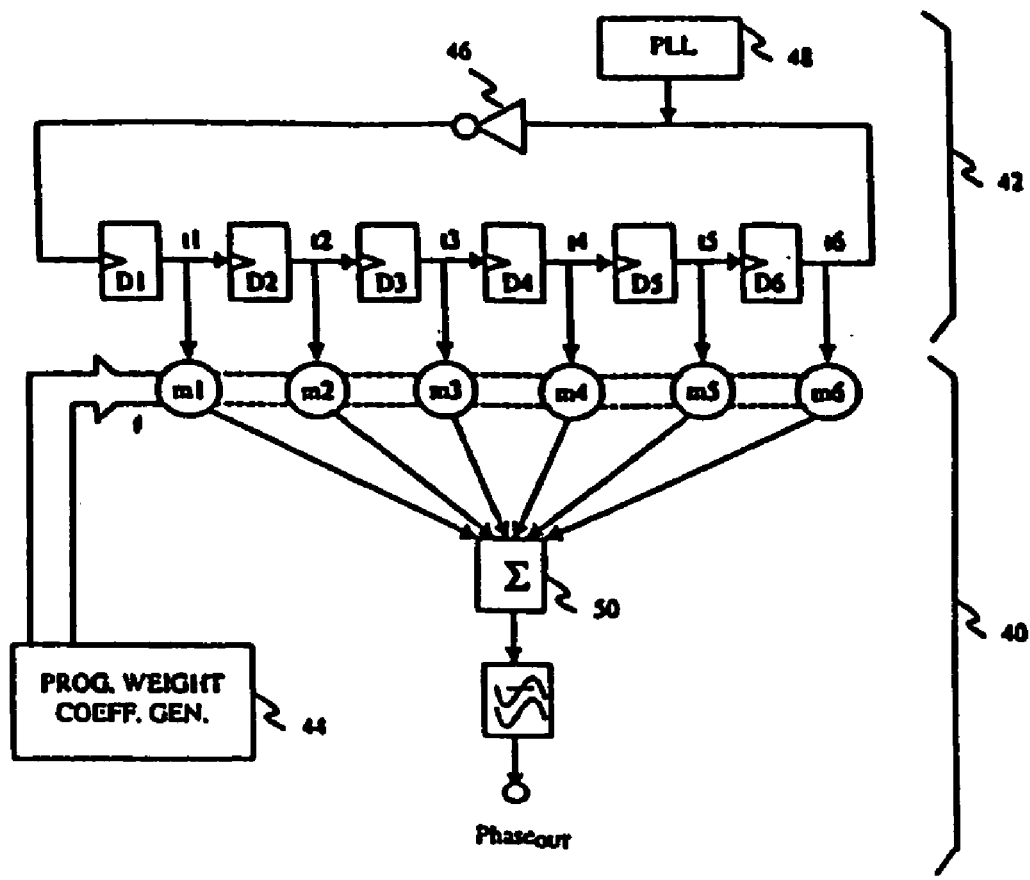
FIG. 7 is a simplified schematic diagram of a part of a phase rotator in accordance with the invention for delivering one phase output, supplied at its input with a digital multiphase clock based on a ring oscillator.

FIG. 7 is a simplified diagram showing the main elements of a phase rotator according to a first embodiment of the present invention, in association with a multiphase clock generator.

The part that forms the phase rotator as such effectively comprises a finite impulse filter (FIR) 40 having n inputs (where n=6 in the example) arranged to receive n mutually different phases of a multiphase frequency generator 42. Each phase is weighted at the FIR filter input by a predetermined dynamically variable weighting coefficient m1–m6 produced by a programmable weighting coefficient generator 44.

The multiphase frequency generator 42 is constructed as a ring oscillator. The latter comprises a chain of n serially connected delay elements D1–D6, such as latches. Accordingly, the input of one delay element receives the delayed output of the immediately preceding delay element. The output of the last delay element D6 is looped back to the input of the first delay element D1 via an inverting amplifier 46. The chain of delay elements produces a total phase shift of $\pi$ radians (180°), while the inverting amplifier 46 produces a further phase shift of $\pi$ radians, so that the complete loop executes a $2\pi$ radian (360°) phase rotation. This condition establishes positive feedback which maintains an oscillating condition. The oscillating circuit is frequency stabilised by a phase locked loop 46 in accordance with classical ring oscillator control techniques.

The output of each delay element D1–D6 is externally accessible by a respective tap t1–t6. The successive taps thus output the oscillating waveform with corresponding successive phase shifts of $\pi/6$ radians.

The outputs from the taps t1–t6 are individually weighted by coefficients produced dynamically by the programmable coefficient generator 44 before being inputted as respective summing inputs to a summing circuit 50.

The output of the FIR filter 40, which is taken out from the summing circuit 50, delivers a phase shifted signal corresponding to the sum of the weighted inputs.

Although only one FIR filter 40 is illustrated in FIG. 3, the phase rotator in accordance with the invention normally comprises a plurality of such FIR filters each receiving separate weighting coefficients from the programmable coefficient generator 44.

Figure 8:
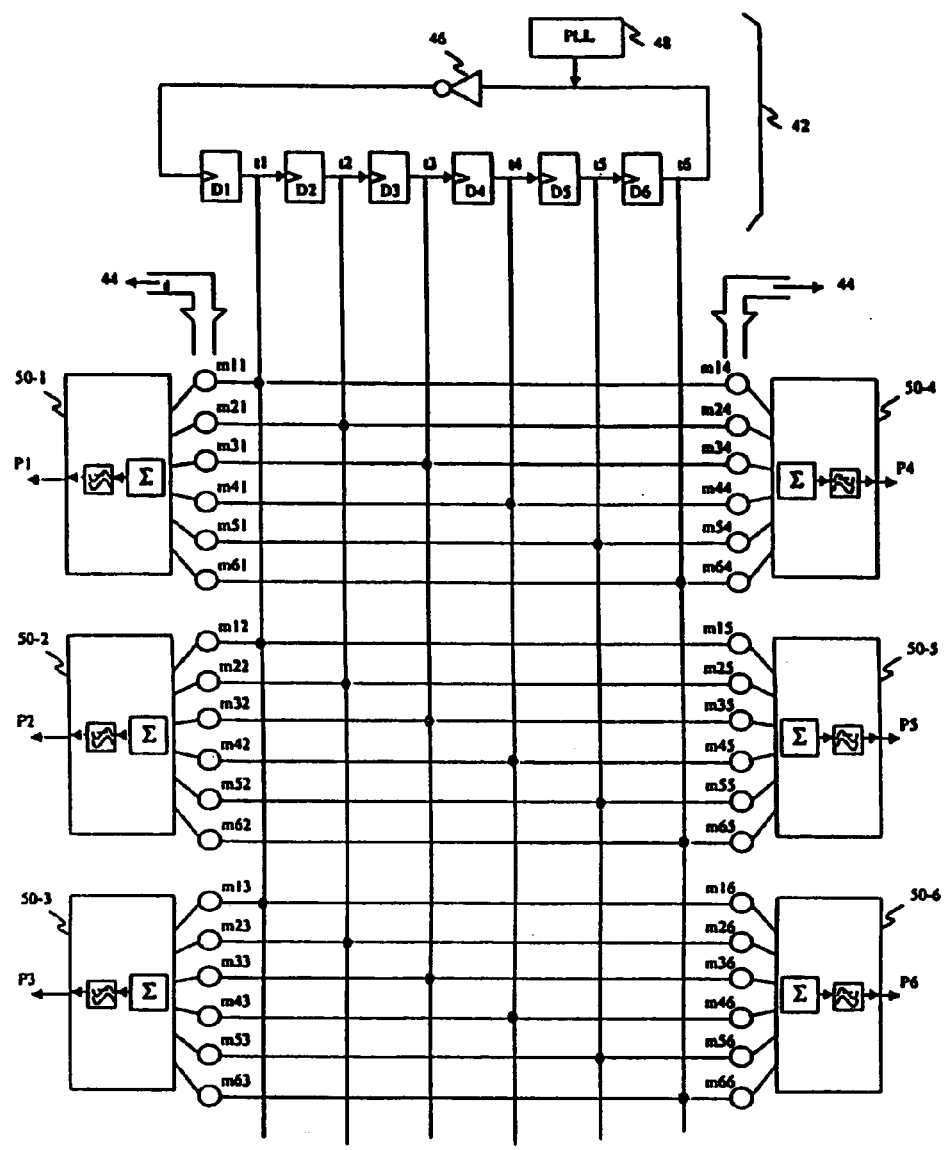
FIG. 8 is a simplified schematic diagram of the phase rotator of FIG. 7 in its complete configuration for delivering n output phases from n input phases of the digital multiphase clock.

For instance, FIG. 8 shows the arrangement according to FIG. 7 adapted to form a phase rotator that receives n phases from the above-described PLL controlled ring oscillator 42 and produces therefrom n shifted phases, where n is also equal to 6.

Each output phase P1–P6 is produced by a respective summing circuit 50-1 to 50-6. As in FIG. 7, each summing circuit 50-1 to 50-6 has n summing inputs that respectively receive the n different phases from the ring oscillator 42, weighted by a specific variable coefficient m11–m66 supplied by the programmable coefficient generator 44.

Figure 9:
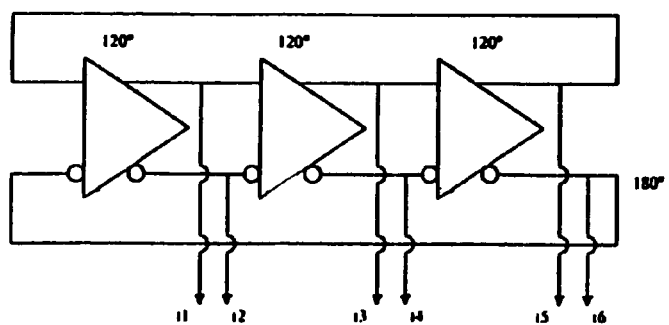
FIG. 9 is a circuit diagram of an alternative ring oscillator useable with the phase rotator of FIG. 7.

FIG. 9 shows a possible variant to the ring oscillator 42 of FIGS. 7 or 8 in the form of a differential ring oscillator which also produces six evenly spaced phases of an oscillating waveform at tapped outputs t1–t6. The circuit is composed of three differential input buffers each having an inverting and a non-inverting input and two outputs which are phase-shifted with respect to the other Depending on the circuit manufacturing technology used, this type of ring oscillator can be easier to produce.

The operation of the phase rotator in accordance with the invention shall now be explained with reference to FIGS. 10 to 12B.

It is first recalled that an FIR filter is a linear phase system if the weighting coefficients are symmetrical. For instance, in the case of the circuit shown in FIG. 7, the weighting coefficients m1 to m6 would be correlated as follows: m1=m6, m2=m5 and m3=m4. Such a symmetrical system configuration gives a linear phase response.

Starting from this principle, the phase rotator modifies the distribution of the weighting coefficients m1–m6 in successive steps to produce another phase response. As will appear below, the changes in the weighting coefficients can be tailored to yield a predetermined phase shift with respect to the signal delivered by the frequency generator 42.

Figure 10:
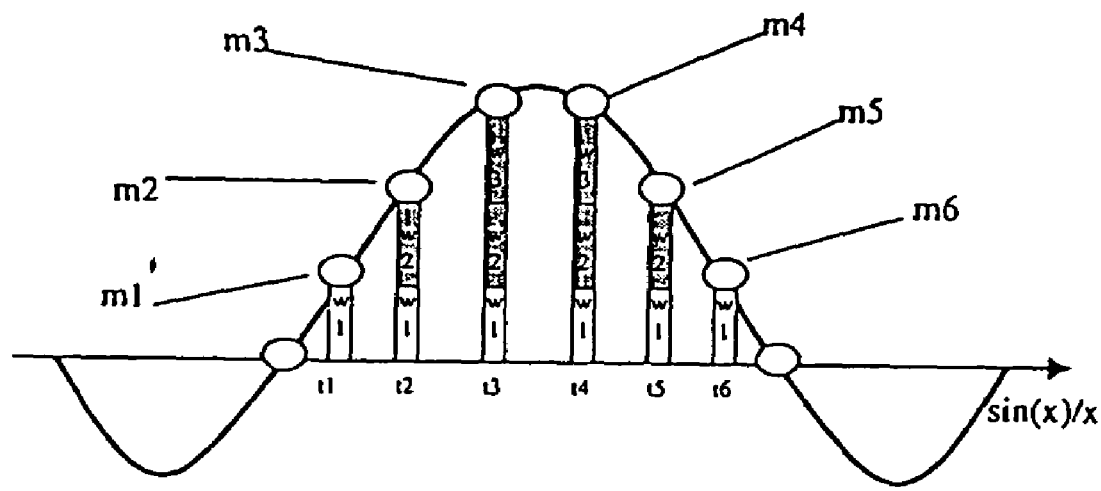
FIG. 10 shows a sinusoidal waveform analysed in terms of starting-point weighting coefficients at different phase slices in accordance with the operating principle of a phase rotator processing six input phases.

FIG. 10 shows one period of a waveform according to the function a=sin(x)/x, formed by the weighted phase contributions of six different equally-spaced phases at tap outputs t1–t6. The latter are delivered by the ring oscillator 42 shown in FIG. 7 or 8. Here, the waveform is symmetrical and corresponds to the configuration for a starting step on which a phase rotation shall be performed in accordance with the invention.

The six weighting coefficients m1–m6 are formed from a set of sub-weights, denoted w1, w2 and w3, each having a predetermined value. As illustrated, a non-zero weighting coefficient is composed of one, two or all three of the sub-weights w1–w3 in an additive combination. Thus, at the starting step, the weighting coefficients are as follows: m1 and m6=w1; m2 and m5=w1+w2; and m3 and m4=w1+w2+w3.

From this starting point, the programmable coefficient generator 44 (FIG. 7) is set to modify the attribution of the sub-weights to the weighting coefficients in a sequence of steps such as to produce a desired phase shift in the waveform.

Table II shows the evolution of the sub-weights w1–w3 assigned to the weighting coefficients m1–m6 in a four-step phase shifting sequence for the phase rotator of FIG. 7, where the first step (step 1) corresponds to the starting configuration. The notation used in the table is based on binary selection codes, configured as temperature codes, used to switch on or off a given sub-weight in a given weighting coefficient. Each of the sub-weights w1, w2 and w3 corresponds to a rank in a group of three binary digits corresponding respectively to a least significant bit (lsb), a middle bit and a most significant bit (msb). The presence of a sub-weight in a given weighting coefficient is expressed by a '1' at the corresponding rank in the binary digit group, while its absence is expressed by a '0' at that rank. For instance, a weighting coefficient formed by the addition of sub-weights w1 and w2 (and hence the absence of sub-weight w3) is expressed by the binary digit group 011, the left-hand most digit being the msb.

TABLE II three-step evolution of weighting coefficients m1–m6 in terms of sub-weights w1–w3.

| Weighting coeff. | m1 | m2 | m3 | m4 | m5 | m6 |
|---|---|---|---|---|---|---|
| Step 0 (init.) | 001 | 011 | 111 | 111 | 011 | 001 |
| Step 1 | 000 | 011 | 111 | 111 | 011 | 011 |
| Step 2 | 000 | 011 | 011 | 111 | 111 | 011 |
| Step 3 | 001 | 001 | 011 | 111 | 111 | 011 |

It can be noted that the evolutions in the weighting coefficients after the initial step and before arriving at a final, phase shifted waveform (step 3) create an asymmetry in the weight settings. This contrasts with a linear FIR filter operation, in which the weights or coefficients must be symmetrical. However, the asymmetry is not problematical when the phase shift is performed in sufficiently small steps so as to keep duty cycle distortion to a minimum.

In order to keep the duty cycle within reasonable limits, it is preferable to change at each intermediate step a sub-weight on each side of the symmetry line of the tapped outputs t0 to t6. The changes are generally complementary in that when a sub-weight is removed at one side of the symmetry line, a sub-weight is added at the other, and vice versa. However, as table II shows, the complementary changes are not necessarily by the same value of sub-weight, nor do they necessarily involve mirror positions about the symmetry line. Here, the term symmetry line is understood to mean the line that delimits the first n/2 phases from the second n/2 phases at the n weighted inputs of the phase rotator. For instance, in a six-input phase rotator, the symmetry line would be between taps t3 and t4.

In accordance with this principle, the first transition (step 1) involves removing sub-weight w1 from weighting coefficient m1 (the latter then becoming 0) and simultaneously adding sub-weight w2 to weighting coefficient m6 (the latter then becoming w1+w2). Similarly, the following intermediate transition (step 2) involves removing sub-weight w3 from weighting coefficient m3 and adding sub-weight w3 to weighting coefficient m5.

As opposed to the intermediate steps, the final transition (step 3) only involves changes on one side of the symmetry line (adding sub-weight w1 to weighting coefficient m1 and removing sub-weight w2 from weighting coefficient m2). This final transition thereby restores the original waveform with a phase step of one phase slice, i.e. one elementary phase shift. In other words, in going from step 0 to step 3 above, each weighting coefficient m1 to m6—and hence the output waveform—is shifted by one tap position. Thus, as shown in table II, the weighting coefficient for m1 becomes the weighting coefficient for m2 and, more generally, the weighting coefficient for mi becomes the weighting coefficient for mi+1, where i is an integer in modulo n arithmetic.

It will be appreciated that by repetition of the above sequence of steps, any phase setting may be tuned in.

Moreover, the inputs to the phase rotator 40 exhibit a circular—or "round robin"—phase sequence, i.e. the phase subsequent to the $n^{th}$ phase (at the last tapping) is looped back to the first tapping, after a phase shift of $\pi$ radians (180°). This feature allows the phase rotator to produce a phase shift which is not limited to a 0 to $2\pi$ radian interval, but is an unbounded amount at either end of the tapped inputs. Accordingly, the phase rotator can be used to produce a stepwise continuous variation of the phase, and hence a frequency adjustment.

Because the weighting coefficients are only changed by adding or subtracting one sub-weight at the time, the output is substantially glitch free.

As can be understood, the fineness in the granularity—or smoothness—in the phase shift produced by the phase rotator depends on two parameters: the number n of input phases used, and the number of steps taken to perform a shift of one phase slice. The smoothness is directly proportional to each of these two parameters. For instance, in the example of FIG. 7 and table II, there are n=6 phases, which means that each elementary phase slice corresponds to a phase shift of $\pi/6$ radians. This phase slice is obtained in three transitions (steps 1 to 3). Therefore, each transition effectively involves a phase jump of $\pi/18$ radians. In other words, the basic grain size or quantum of phase shift is generally equal to $\pi/(n.s)$ radians, where n is the number of input phases to the phase rotator, and s is the number of elementary transitions (changes in the weighting coefficients) involved to produce a shift of one phase slice.

In practice, the number of elementary transitions s is related to the number of input phases to the phase rotator by the formula: s=n/2. Because the number s must be an integer, the number n of input phases is even. The above-described principle and operation of the phase rotator can be extrapolated to any even value for n.

There shall now be explained the elementary transitions for a phase rotator having n=8 phase inputs and performing a shift of one phase slice in four elementary transitions. In this case, the quantum of phase shift at each transition is reduced to $\pi/(8\times4)=\pi/32$ radians compared to $\pi/18$ radians in the case of the 6-input phase rotator.

For an 8-input operation, the phase rotator 40 of FIGS. 7 and 8 is thus modified to accept eight input phases produced at respective taps t1 to t8 of a ring oscillator comprised of eight delay elements D1 to D8 (instead of the six shown in FIGS. 7 and 8). The eight taps thereby produce successive and equally-spaced phase displacements of $\pi/8$ radians. The programmable weighting coefficient generator 44 is set to produce eight weighting coefficients m1 to m8. Each weighting coefficient is composed by an additive combination of four sub-weights w1 to w4.

Figure 11:
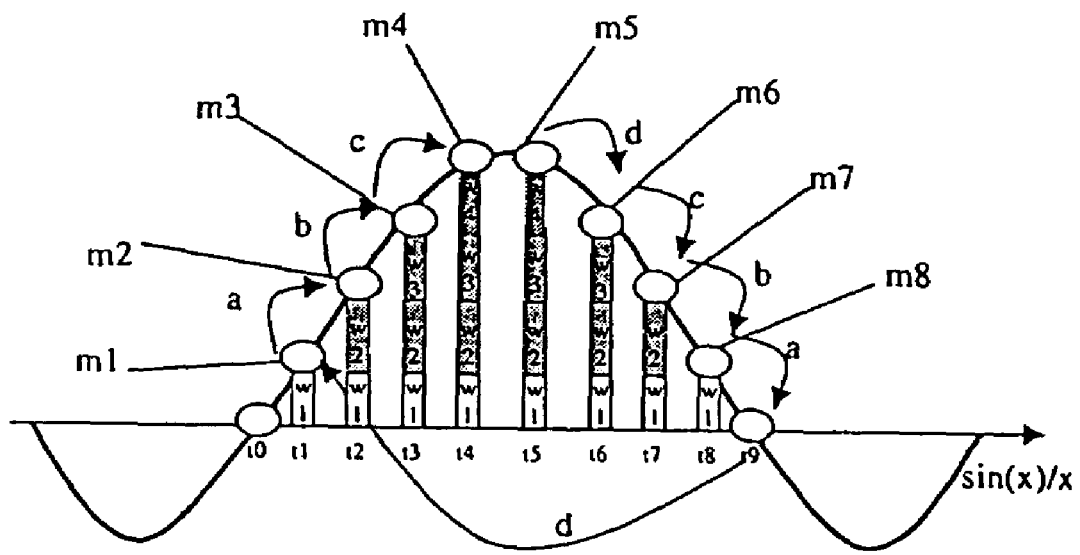
FIG. 11 shows a sinusoidal waveform analysed in terms of starting-point weighting coefficients at different phase slices in accordance with the operating principle of a phase rotator processing eight input phases.

FIG. 11 shows the distribution of sub-weights w1–w4 which initially make up the non-zero amplitude values of one period of a waveform. At the starting step, the weighting coefficients are as follows: m1 and m8=w1; m2 and m7=w1+w2; m3 and m6=w1+w2+w3; m4 and m5=w1+w2+w3+w4.

Table III shows the evolution of the sub-weights w1–w4 assigned to the weighting coefficients m1–m8 in a four-step phase shifting sequence, where the first step (step 0) corresponds to the starting configuration.

By analogy to the notation used in table II above, each sub-weight w1–w4 corresponds to a rank in a group of four binary digits, where sub-weight w1 corresponds to the lsb (right-most bit) and w4 corresponds to the msb (left-most bit). For instance, the weighting coefficient formed by the addition of sub-weights w1, w2 and w3 (and hence no sub-weight w4) is expressed by the binary digit group or temperature code 0111.

TABLE III four-step evolution of weighting coefficients m1–m8 in terms of sub-weights w1–w4 to produce a phase shift of one phase slice.

| Weighting coeff. | m1 | m2 | m3 | m4 | m5 | m6 | m7 | m8 |
|---|---|---|---|---|---|---|---|---|
| Step 0 (init.) | 0001 | 0011 | 0111 | 1111 | 1111 | 0111 | 0011 | 0001 |
| Step 1 | 0011 | 0011 | 0111 | 1111 | 1111 | 0111 | 0011 | 0000 |
| Step 2 | 0011 | 0111 | 0111 | 1111 | 1111 | 0111 | 0001 | 0000 |
| Step 3 | 0011 | 0111 | 0111 | 1111 | 1111 | 0111 | 0001 | 0000 |
| Step 4 | 0011 | 0111 | 1111 | 1111 | 0111 | 0011 | 0001 | 0001 |

The four elementary phase transition steps (at steps 1, 2, 3 and 4) can be followed on the waveform of FIG. 11 by the arrows a to d respectively.

In this example, the four elementary transitions yield a phase rotation corresponding to a lag of one phase slice, i.e. −π/8 radians. Thus, the final configuration of the weighting coefficients m1–m8 (step 4) is shifted by one unit to the left relative to the initial state configuration, i.e. the weighting coefficient originally for m8 is applied to m7, that originally for m7 is applied to m6, etc, with the original weighting coefficient for m1 looped to be applied to m8.

As in the example of Table II, the intermediate elementary transition steps involve a change of sub-weights at each side of the symmetry line, the latter being in this case between coefficients m4 and m5.

The phase granularity of the above eight-phase, four-step-transition phase shift is π/32 radians.

It will be noted that the binary selection codes used to designate the sub-weights in Tables II and III can be regarded as temperature codes. Techniques for generating and managing such temperature codes are well established in the art and shall not be described in detail for conciseness.

The programmable coefficient generator 44 of FIGS. 7 and 8 can thus be embodied in the form of a temperature code generator, with the temperature codes being decoded e.g. at the level of a weighting coefficient generator. The temperature code generator can be controlled to perform the desired phase shift steps in response to a digital input control signal. The latter can be, for example, a feedback signal from circuitry which analyses the phase shifted outputs so that a phase condition can be maintained in real time through a feedback loop (cf. FIG. 4). For instance, in the case of the receiver described with reference to FIG. 5, the digital control signal would be the early/late signal in the feedback loop. In this case, the early/late signal bits can be counted to obtain a running total value which corresponds to a required degree of phase shift to maintain synchronisation conditions. From this value, the temperature code generator produces the appropriate sequences of temperature codes to effect phase shifts at the level of the phase rotator outputs. The temperature code sequences (for instance the information shown in tables II or III) can be stored in a look-up table and read out in accordance with the control signal.

There shall now be described with reference to FIGS. 12A and 12B the basic construction of a phase rotator configured to receive six input phases and to deliver six output phases that can be dynamically shifted with respect to the input phases.

FIG. 12A is a simplified schematic diagram showing a temperature code generator and a 6 by 6 array of summing and weighting coefficient generating blocks, while FIG. 12B shows a more detailed construction of one such block.

The temperature code generator 70 uses a phase control signal in the form of a five-bit digital phase selection code expressing a sequence of 18 binary digits. From this code are produced six groups of three-digit codes forming respective code sets (Code Set 1–6) supplied to the switching and weighting blocks according to a specific sequence.

The summing and weighting coefficient generating blocks SW1a to SW6f, hereafter referred to as s/w blocks, are elementary units that constitute the basic FIR filter structure 40 of FIGS. 7 and 8. One FIR filter is constructed from a set of six s/w blocks (e.g. SW1a–SW6a) arranged in a column in FIG. 12A. Each s/w block of a given FIR filter receives and processes one respective phase Phase1–Phase6 of a clock signal delivered by an oscillator, for example at a tap t1–t6 of ring oscillator 42 in FIG. 3.

Accordingly, the six columns of s/w blocks in FIG. 12A (SW1a–SW6a, SW1b–SW6b, . . . , SW1f–SW6f) respectively form six FIR filters. Each FIR filter thus receives the six phases of the of the oscillator and a temperature code set from the temperature code generator 70, and produces from these inputs one output phase (resp. Out1–Out6).

These output phases are then sent e.g. to a folded cascade stage where they can be exploited in terms of controllably shifted outputs of the input phases from the oscillator.

The basic construction of an s/w block shall now be described with reference to FIG. 12B, it being noted that the blocks (SW1a–SW6a, SW1b–SW6b, . . . , SW1f–SW6f) shown in FIG. 12A are identical.

An s/w block has three inputs:
a phase input $Phase_{in}$,
a summing input $Sum_{in}$, and
a three-bit selection output $Selection_{in}$,
and three outputs:
a phase output $Phase_{out}$,
a summing output $Sum_{out}$, and
a selection output $Sum_{out}$.

The phase input is directly connected to the phase output, and likewise the selection input is directly connected to the selection output. These direct connections respectively enable the s/w block to relay temperature codes from the temperature code generator 70 and phase inputs from the ring oscillator to other blocks inside the array of s/w blocks.

The summing input is connected to the summing output by a wire link 72. As will be described further, a current is injected into this link within the block. The magnitude of this current is made to correspond to the weighting coefficient commanded for the block by the temperature code supplied to its selection input.

The current is generated by three MOS transistors T1–T3. Each transistor has its source connected to a power supply voltage terminal 74, its drain connected to the wire link 72, and its gate connected to a respective control output from a control logic circuit 76. The latter is designed to receive the three-bit temperature code at the selection input $Selection_{in}$ and to supply the bits of the latter to a respective gate of the three transistors T1–T3 through a corresponding AND gate A1–A3. Specifically, the AND gates have a first input connected to the corresponding bit of the temperature code and a second input connected to the phase input $Phase_{in}$, via a buffer amplifier 78, and an output connected to a gate of its corresponding transistor. Accordingly, the inputted temperature codes are transmitted to the gates of transistors T1–T3 only when the input phase $Phase_{in}$ is high.

The transistors are thus switched on or off in accordance with the value 1 or 0 of their corresponding digit in the input temperature code. When a transistor T1–T3 receives through its AND gate a high logic state corresponding to a '1' in its corresponding temperature code digit, it goes into saturation, whereupon its drain injects an open-channel current into the wire link 72. The value of this current increases with the transistor channel width. Therefore, the channel width of each of the transistors T1–T3 can be individually designed to inject into the wire link the appropriate current corresponding to its respective sub-weight w1–w3, so that the latter can be expressed in terms of a current. The transistors thus define the scaling factor for the value of the sub-weights.

The total current injected into the wire link 72 is equal to the sum of the currents from the three transistors w1–w3.

The use of summing currents to produce the weighting coefficients has the effect that there are no glitches produced. This would not be the case for an analog multiplication.

In the example, each of the three transistors T1–T3 has a different channel width such that the scaling factors of summing transistors are approximately w1:w2:w3=0.30: 0.33:0.26.

Returning to FIG. 12A, it can be understood from the internal configuration of a basic s/w block that each phase Phase1–Phase6 from the oscillator is sent in parallel to each corresponding input $Phase_{in}$ of a corresponding s/w block of each FIR filter.

For each FIR filter, the output current from each constituent s/w block is summed by serially connecting together the wire links 72 of the latter through cascade connections between the inputs $Sum_{in}$ and outputs $Sum_{out}$ as shown. Thus the output Out1, Out2, . . . , or Out6 of each FIR filter is effectively the sum, in terms of a total current, of all the weighted phases Phase1–Phase6.

The temperature codes are elaborated such that a 3-digit code set to be used by an s/w block corresponding to a given phase of one FIR filter is simultaneously useable by an s/w block in each of the other FIR filters, but at mutually different phases. Thus, in the example of FIG. 12A, temperature code set 1 (say) is supplied to s/w block SW1a of a first (left-hand most) FIR filter that receives the phase Phase1 from the oscillator. The s/w block SW1a passes on this temperature code through to its $Selection_{out}$ output to the $Selection_{in}$ input of an s/w block SW2b of its neighbouring FIR filter that receives the phase Phase2 from the oscillator. The latter then passes this temperature code to the s/w block SW3c of its neighbouring FIR filter, etc.

In more general terms, the configuration of the s/w block array in FIG. 12A is wired at the level of the $Selection_{in}$ and $Selection_{out}$ connections such that a temperature code arriving at one of the s/w blocks corresponding to an input phase i of an FIR filter k is transferred by the latter to the s/w block corresponding to the input phase i+1 of its neighbouring FIR filter k+1, where i is an integer in modulo 6 arithmetic and k is an integer between 1 and 5 inclusive.

By virtue of this approach, the temperature code generator needs only to produce one temperature code for each of the different phase inputs in order to satisfy the input requirement of each FIR filter.

Table IV contains a truth table of an example of the temperature codes implemented in the temperature code generator 70 for operating the phase rotator of FIG. 12A. Each temperature code is comprised of three binary digits in accordance with the notation used for tables II and III above, with the lsb (right-hand digit) assigned to transistor T1 controlling sub-weight w2 and the msb assigned to the transistor T3 controlling sub-weight w3.

TABLE IV

Temperature code generator truth table

| Phase Number | Code Set 1 | Code Set 2 | Code Set 3 | Code Set 4 | Code Set 5 | Code Set 6 |
|---|---|---|---|---|---|---|
| 1  | 001 | 011 | 111 | 111 | 011 | 001 |
| 2  | 000 | 011 | 111 | 111 | 011 | 011 |
| 3  | 000 | 001 | 111 | 111 | 111 | 011 |
| 4  | 001 | 001 | 011 | 111 | 111 | 011 |
| 5  | 011 | 000 | 011 | 111 | 111 | 011 |
| 6  | 011 | 000 | 001 | 111 | 111 | 111 |
| 7  | 011 | 001 | 001 | 011 | 111 | 111 |
| 8  | 011 | 011 | 000 | 011 | 111 | 111 |
| 9  | 111 | 011 | 000 | 001 | 111 | 111 |
| 10 | 111 | 011 | 001 | 001 | 011 | 111 |
| 11 | 111 | 011 | 011 | 000 | 011 | 111 |
| 12 | 111 | 111 | 011 | 000 | 001 | 111 |
| 13 | 111 | 111 | 011 | 001 | 001 | 011 |
| 14 | 111 | 111 | 011 | 011 | 000 | 011 |
| 15 | 111 | 111 | 111 | 011 | 000 | 001 |
| 16 | 011 | 111 | 111 | 011 | 001 | 001 |
| 17 | 011 | 111 | 111 | 011 | 011 | 000 |
| 18 | 001 | 111 | 111 | 111 | 011 | 000 |

The truth table covers 18 phase steps for six phases at the input. It may be noticed that in the truth table of Table IV, all code sets have the same alphabet of bit patterns, but the sequence of bit patterns is shifted by three phase numbers from code set n to code set n+1. This can also be seen from FIG. 12A, for example, by the line that stands for the code set 1 bus and goes from SW1a to SW2b.

As explained above, the smoothness of the phase shifting by the phase rotator depends on the number of input phases processed and the number of transition steps performed to shift the output by one phase slice.

It is also possible to improve the smoothness of the phase shifts by further dividing each of the above-described sub-weights into sub-sub-weights. For instance, each sub-weight w1–w3 (or w1–w4 discussed above, but not shown) could be itself composed of an additive combination of e.g. two or three sub-sub-weights which in total have the same size as the sub-weight. In this case, each transition step would be the result of successive sub-steps involving additive combinations of the sub-sub-weights.

The sub-sub-weights could also be implemented by transistors having a specific drain-source channel width. These transistors would then be selectively switched on or off by corresponding temperature sub-codes. For instance, a transistor T1, T2 or T3 of FIG. 12B would be replaced by a group of smaller transistors each controlled a respective digit of the above temperature sub-code.

In practice, there is a limit to the degree to the smallness of the granularity that is desired in the phase adjustment steps. This is notably the case with the application of the phase rotator to a data recovery receiver as described with reference to FIG. 5, for example. Indeed, if there is a clock offset between clock signals in the incoming data stream and the local clock (e.g. the ring oscillator PLL), it is necessary to perform a frequency adaptation from the incoming to the local clock. This is done in pseudo-continuous phase steps. If the granularity is extremely fine, a correspondingly large number of clock cycles is needed to track the corresponding phase shifts, and a trade-off is thereby imposed between fineness of granularity and response speed.

It can be noted that even though the phase rotator processes single ended signals, there are still differential signals available. The outputs Out0 and Out3 in FIG. 7 for example are complementary. In order to generate higher quality clock signals, differential clock buffers can be connected to these complementary signals. This enhances noise immunity and improves duty cycle stability.

The AND gates of the s/w blocks in FIG. 12B may be constructed from simple transmission gates in order to reduce power dissipation.

The load on the drivers supplying the input phases is more-or-less constant and measures twice the sum of the transistors T1–T3.

While the invention has been described in terms of a single preferred embodiment, those skilled in the art will recognize that the invention can be practiced with modification within the spirit and scope of the appended claims.

What is claimed is:

1. A phase rotator device for controllably effecting a phase shift on an oscillating signal, comprising:
    an input device having at least four input channels for receiving at least four phases of said oscillating signal;
    an output device having at least one output channel for delivering at least one phase of said oscillating signal with a controlled phase shift;
    a weighting device for weighting the value of the oscillating signal at each input channel by a respective weighting coefficient;
    a summing device for summing the weighted signal values at each input channel and delivering the summed value as a shifted output phase at said output channel; and
    a weighting coefficient supply device responsive to a phase shift control signal for controllably supplying evolving weighting coefficients to said weighting device thereby to create a phase shift at the at least one output channel, wherein the weighting coefficients are adapted to evolve controllably for effecting a phase shift in successive phase slices over a phase angle of $2\pi$ radians in a cyclic operation, thereby permitting an unlimited phase shift.

2. The phase rotator device according to claim 1, wherein said weighting coefficient supply device is adapted to process a phase shift control signal in digital form.

3. The phase rotator device according to claim 1, further comprising an analog low pass filtering device, located at one or more of the at least four input channels, and the output channel, as part of the weighting device and the summing device.

4. The phase rotator device according to claim 3, further comprising a second analog low pass filtering device operative for filtering the input signals.

5. The phase rotator device according to claim 1, wherein each of said at least four input channels are adapted to receive a respective phase slice of said oscillating signal.

6. The phase rotator device according to claim 1, wherein the phase shift applied to said at least one output channel is individually controllable and differs from the phase shift applied to all other channels.

7. The phase rotator device according to claim 6, wherein distribution of weighting coefficients among the input channels at some of the intermediate transition steps at least is unbalanced about the symmetry line of said input channels.

8. The phase rotator device according to claim 7, wherein each transition step involves a change in only some among the weighting coefficients applied at each of said input channels.

9. The phase rotator device according to claim 8, wherein at least one of said m transitions steps, and preferably all the intermediate transition steps, involves a change of weighting coefficient for at least one input channel on either side of the symmetry line of said n input channels.

10. The phase rotator device according to claim 8, wherein at least one of the weighting coefficients comprise an additive combination of sub-weights.

11. The phase rotator device according to claim 10, wherein the weighting coefficient supply device is arranged to add or remove selectively one sub-weight per transition step to a weighting coefficient to be changed at that transition step.

12. The phase rotator device according to claim 11, wherein the sub-weights are switched in or out of said additive combination by digital control signals comprising temperature codes generated by said weighting coefficient supply device.

13. The phase rotator device according to claim 12, wherein a weighting coefficient comprises a current, produced by selectively adding current components each corresponding to a sub-weight forming said weighting coefficient.

14. The phase rotator device according to claim 13, wherein the sub-weight is controlled by an ON resistance of a transistor having a specific channel width which determines the current corresponding to the associated sub-weight.

15. The phase rotator device according to claim 14, wherein at least one sub-weight comprises an additive combination of sub-sub-weights.

16. The phase rotator device according to claim 15, wherein the weighting coefficient supply device is arranged to add or remove selectively one sub-sub-weight per transition sub-step to a weighting coefficient to be changed at that transition step.

17. The device of claim 1, wherein said weighting coefficients comprise time-continuous weighting coefficients.

18. A method of controllably effecting a phase shift on an oscilating signal, in which at least one phase of an oscillating signal is received on at least one input channel and is reproduced on at least one output channel with a controlled phase shift, said method comprising:
    weighting the value of the oscillating signal at each input channel by a respective weighting coefficient;
    summing the weighted signal values at each input channel and delivering the summed value as a shifted output phase at said output channel; and
    evolving the weighting coefficients thereby to create a phase shift at the one or each output channel, wherein the weighting coefficients evolve controllably for effecting a phase shift in successive phase slices over a phase angle of $2\pi$ radians in a cyclic operation, thereby permitting an unlimited phase shift.

19. The method according to claim 18, wherein said weighting coefficients are controlled by digital signals.

20. The method according to claim 18, further comprising filtering said at least one output channel.

21. The method according to claim 20, wherein said filtering comprises analog low pass filtering and is performed substantially simultaneously with at least one of the weighting and the summing.

22. The method according to claim 18, further comprising low pass filtering said at least one input channel.

23. The method according to claim 18, wherein said at least one input channel is adapted to receive a respective phase slice of said oscillating signal.

24. The method according to claim 18, wherein the weighting coefficients each comprise an additive combination of sub-weights.

25. The method according to claim 24, wherein the weighting coefficients evolve by selectively adding and removing one sub-weight per transition step to a weighting coefficient to be changed at that transition step.

26. The method according to claim 24, wherein the sub-weights are switched in and out of said additive combination by digital control signals comprising temperature codes.

27. The method according to claim 24, wherein a weighting coefficient comprises a current produced by selectively adding current components each corresponding to a sub-weight comprising said weighting coefficient.

28. The method of claim 18, wherein said weighting coefficients comprise time-continuous weighting coefficients.

29. A phase rotator device for controllably effecting a phase shift on an oscillating signal, comprising:
- an input device having at least four input channels for receiving at least four phases of said oscillating signal;
- an output device having at least one output channel for delivering at least one phase of said oscillating signal with a controlled phase shift;
- a weighting device for weighting the value of the oscillating signal at each input channel by a respective weighting coefficient;
- a summing device for summing the weighted signal values at each input channel and delivering the summed value as a shifted output phase at said output channel; and
- a weighting coefficient supply device responsive to a phase shift control signal for controllably supplying evolving weighting coefficients to said weighting device thereby to create a phase shift at the at least one output channel, wherein said weighting coefficient supply device evolves said weighting coefficients in a series of transition steps, and wherein said series of transition steps effect the phase shift in successive phase slices over a phase angle of $2\pi$ radians.

30. A phase rotator device for controllably effecting a phase shift on an oscillating signal, comprising:
- an input device having at least four input channels for receiving at least four phases of said oscillating signal;
- an output device having at least one output channel for delivering at least one phase of said oscillating signal with a controlled phase shift;
- a weighting device for weighting the value of the oscillating signal at each input channel by a respective weighting coefficient;
- a summing device for summing the weighted signal values at each input channel and delivering the summed value as a shifted output phase at said output channel; and
- a weighting coefficient supply device responsive to a phase shift control signal for controllably supplying evolving weighting coefficients to said weighting device thereby to create a phase shift at the at least one output channel, wherein said weighing coefficient supply device evolves said weighting coefficients in a series of transition steps, and wherein each of said weighting coefficients comprises at least one of a plurality of predetermined sub-weights.

31. The device of claim 30, wherein at least one of said series of transition steps comprises at least one of adding and removing one of said plurality of predetermined sub-weights from one of said weighting coefficients.

32. The device of claim 31, wherein said at least one of said series of transition steps comprises at least one of the other of adding and removing one of said plurality of predetermined sub-weight to another one of said weighting coefficients.

33. The device of claim 32, wherein said one of said weighting coefficients is on one side of a symmetry line and the another one of said weighting coefficients is on the other side of the symmetry line.

34. The device of claim 30, wherein each of said plurality of predetermined sub-weights corresponds to one of a plurality of temperature codes.

35. The device of claim 34, wherein each of said plurality of predetermined sub-weights corresponds to a rank in a group of binary digits of said plurality of temperature codes.

36. The device of claim 30, wherein each of said plurality of predetermined sub-weights comprises a predetermined plurality of sub-sub-weights.

37. A phase rotator device for controllably effecting a phase shift on an oscillating signal, comprising:
- an input device having at least four input channels for receiving at least four phases of said oscillating signal;
- an output device having at least one output channel for delivering at least one phase of said oscillating signal with a controlled phase shift;
- a weighting device for weighting the value of the oscillating signal at each input channel by a respective weighting coefficient;
- a summing device for summing the weighted signal values at each input channel and delivering the summed value as a shifted output phase at said output channel; and
- a weighting coefficient supply device responsive to a phase shift control signal for controllably supplying evolving weighting coefficients to said weighting device thereby to create a phase shift at the at least one output channel wherein said weighting coefficient supply device evolves said weighting coefficients in a series of transition steps, and wherein at least one of said series of transition steps provides an asymmetry in said weighting coefficients.

38. A phase rotator device for controllably effecting a phase shift on an oscillating signal, comprising:
- an input device having at least four input channels for receiving at least four phases of said oscillating signal;
- an output device having at least one output channel for delivering at least one phase of said oscillating signal with a controlled phase shift;
- a weighting device for weighting the value of the oscillating signal at each input channel by a respective weighting coefficient;
- a summing device for summing the weighted signal values at each input channel and delivering the summed value as a shifted output phase at said output channel; and
- a weighting coefficient supply device responsive to a phase shift control signal for controllably supplying evolving weighting coefficients to said weighting device thereby to create a phase shift at the at least one output channel, wherein said weighting coefficient supply device evolves said weighting coefficients in a series of transition steps, and wherein the size of at least one of said series of transition steps minimizes a distortion in a duty cycle.

39. A phase rotator device for controllably effecting a phase shift on an oscillating signal, comprising:
- an input device having at least four input channels for receiving at least four phases of said oscillating signal;
- an output device having at least one output channel for delivering at least one phase of said oscillating signal with a controlled phase shift;

a weighting device for weighting the value of the oscillating signal at each input channel by a respective weighting coefficient;

a summing device for summing the weighted signal values at each input channel and delivering the summed value as a shifted output phase at said output channel; and a weighting coefficient supply device responsive to a phase shift control signal for controllably supplying evolving weighting coefficients to said weighting device thereby to create a phase shift at the at least one output channel, wherein said weighting coefficient supply device evolves said weighting coefficients in a series of transition steps, and wherein the number of the series of transitions to perform said phase shift is equal to one-half of the number of input channels.

* * * * *